United States Patent
Bandara et al.

(10) Patent No.: US 12,396,130 B2
(45) Date of Patent: Aug. 19, 2025

(54) SYSTEMS AND METHODS FOR MONITORING A FLUID LINE IN A VEHICLE

(71) Applicant: GM GLOBAL TECHNOLOGY OPERATIONS LLC, Detroit, MI (US)

(72) Inventors: Pulasti Bandara, Richmond Hill (CA); Karl Bo Albert Mikkelsen, Peachland (CA); Rui Cheng, Markham (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 278 days.

(21) Appl. No.: 18/447,417

(22) Filed: Aug. 10, 2023

(65) Prior Publication Data
US 2025/0056763 A1 Feb. 13, 2025

(51) Int. Cl.
  *H05K 7/20* (2006.01)
  *G07C 5/02* (2006.01)
  *G07C 5/08* (2006.01)
  *B60R 16/08* (2006.01)

(52) U.S. Cl.
  CPC .......... *H05K 7/20281* (2013.01); *G07C 5/02* (2013.01); *G07C 5/0808* (2013.01); *B60R 16/08* (2013.01)

(58) Field of Classification Search
  CPC ............ H05K 7/20281; B60H 1/00885; B60H 1/00278; B60H 1/00807; B60H 1/3205; B60H 1/3228; B60K 11/02
  See application file for complete search history.

(56) References Cited

U.S. PATENT DOCUMENTS

| | | | | |
|---|---|---|---|---|
| 11,346,205 B2 * | 5/2022 | Kalia | ............. | E21B 17/006 |
| 12,345,279 B2 * | 7/2025 | Yamarthi | ............. | F04D 29/056 |

FOREIGN PATENT DOCUMENTS

| | | | | |
|---|---|---|---|---|
| BR | PI0803721 A2 * | 6/2009 | ............. | E21B 43/12 |
| FR | 2997449 A1 * | 5/2014 | ............. | F02B 29/0443 |
| WO | WO-2017049388 A1 * | 3/2017 | ............. | G08B 21/187 |

* cited by examiner

*Primary Examiner* — Hung Q Nguyen
(74) *Attorney, Agent, or Firm* — Ingrassia Fisher & Lorenz, LLP | IF&L (57) ABSTRACT

Systems and methods are provided for monitoring fluid line in a vehicle configured to remove heat from an electronic device with a coolant. The systems may include a pump configured to flow the coolant through the fluid line, a sensing device configured to sense vibrations in the fluid line, and a controller that is configured to: receive vehicle state data, determine a recommended flow rate of the coolant based on the vehicle state data, determine vibration signal thresholds based on the vehicle state data and the recommended flow rate, initiate operation of the pump to flow the coolant at the recommended flow rate, determine whether the flow of the coolant is stable, receive sensor data indicative of the vibrations, determine signal characteristic(s) of the vibrations while the flow is stable, and initiate a remedial action based on a comparison of the signal characteristic(s) to the vibration signal thresholds.

20 Claims, 5 Drawing Sheets

SYSTEMS AND METHODS FOR MONITORING A FLUID LINE IN A VEHICLE

INTRODUCTION

The technical field generally relates to electronic device cooling systems for vehicles, and more particularly relates to systems and methods for monitoring coolant flow within a cooling system of a vehicle.

Modern vehicles are equipped with a wide array of electronics, ranging from advanced infotainment systems to sophisticated engine control units and safety features. While these electronic components enhance vehicle performance, efficiency, and comfort, they also generate significant amounts of heat during operation. Managing this heat effectively is a major challenge faced by automotive engineers. Excess heat can lead to performance degradation, reduced efficiency, and even component failure. Heat dissipation systems, such as cooling fans, heat sinks, liquid coolants, and thermal management algorithms, are employed to regulate temperatures and prevent overheating. As vehicles become more electrified and incorporate higher-powered electronics, the demand for efficient heat management solutions continues to grow to ensure the reliability and longevity of modern automotive electronics.

Accordingly, it is desirable to provide systems and methods for promoting heat dissipation and cooling system monitoring for vehicles. Furthermore, other desirable features and characteristics of the present invention will become apparent from the subsequent detailed description and the appended claims, taken in conjunction with the accompanying drawings and the foregoing technical field and background.

SUMMARY

A method is provided for monitoring a fluid line in a vehicle. In one example, the method includes receiving, by one or more processors, vehicle state data of the vehicle, determining, by the one or more processors, a recommended flow rate of a coolant based on the vehicle state data, determining, by the one or more processors, vibration signal thresholds based on the vehicle state data and the recommended flow rate, operating a pump of the vehicle to flow the coolant through the fluid line at the recommended flow rate to remove heat generated by an electronic device of the vehicle, wherein the recommended flow rate is configured to maintain the electronic device below a predetermined temperature, determining, by the one or more processors, whether the flow of the coolant through the fluid line is stable, sensing, with a sensing device of the vehicle, vibrations in the fluid line caused by the flow of the coolant therein, determining, by the one or more processors, one or more signal characteristics of the vibrations sensed with the sensing device while the flow of the coolant through the fluid line was stable, and initiating, by the one or more processors, a remedial action based on a comparison of the one or more signal characteristics of the vibrations to the vibration signal thresholds.

In various examples, the method includes the vehicle state data includes at least one of a temperature of the coolant, a heating or cooling status of a battery of the vehicle, a power electronics cooling status, a charging status of the vehicle, a drive mode of the vehicle, and a speed of the vehicle.

In various examples, the sensing device used in the method is disposed at a location downstream of a geometry change in the fluid line that is configured to amplify a vibration signal sensed in the fluid line at the location of the sensing device.

In various examples, the sensing device used in the method is disposed at a location downstream of a geometry change in the fluid line such that the flow of the coolant prior to the geometry change is transverse to the flow of the coolant at the location of the sensing device.

In various examples, the sensing device used in the method is disposed at a location downstream of an arcuate right angle bend in the fluid line such that the flow of the coolant prior to right angle bend is perpendicular to the flow of the coolant at the location of the sensing device.

In various examples, the vibration signal thresholds of the method include a first threshold having a first signal characteristic and a second threshold having a second signal characteristic, wherein the second signal characteristic is less than the first signal characteristic, the method including determining, by the one or more processors, that the flow of the coolant through the fluid line is normal in response to the one or more signal characteristics of the vibrations being greater than the first threshold, that the flow of the coolant through the fluid line is low or aerated in response to the one or more signal characteristics of the vibrations being between the first threshold and the second threshold, and that there is no flow of the coolant through the fluid line in response to the one or more signal characteristics of the vibrations being less than the second threshold.

In various examples, the remedial action of the method includes reporting a classification of the flow of the coolant through the fluid line to another component of the vehicle.

In various examples, the remedial action of the method includes initiating a de-aeration process configured to reduce a concentration of air within the fluid line.

In various examples, the sensing device used in the method is an accelerometer functionally coupled to an exterior of the fluid line such that the accelerometer senses the vibrations of the fluid line without contacting the coolant, and the one or more signal characteristics include at least one of a frequency and an amplitude of the vibrations sensed by the accelerometer.

A system is provided for a vehicle. In one example, the system includes a cooling system comprising a fluid line configured to remove heat generated by an electronic device of the vehicle with a coolant, a pump configured to flow the coolant through the fluid line of the cooling system, a sensing device configured to sense vibrations in the fluid line caused by the flow of the coolant, and a controller in operable communication with the pump and the sensing device. The controller is configured to, by one or more processors: receive vehicle state data of the vehicle, determine a recommended flow rate of the coolant of the cooling system based on the vehicle state data, wherein the recommended flow rate is configured to maintain the electronic device below a predetermined temperature, determine vibration signal thresholds based on the vehicle state data and the recommended flow rate, initiate operation of the pump to flow the coolant through the fluid line at the recommended flow rate, determine whether the flow of the coolant through the fluid line is stable, receive, from the sensing device, sensor data indicative of the vibrations sensed in the fluid line, determine one or more signal characteristics of the vibrations sensed with the sensing device while the flow of the coolant through the fluid line is stable, and initiate a remedial action based on a comparison of the one or more signal characteristics of the vibrations to the vibration signal thresholds.

In various examples, the vehicle state data of the system includes at least one of a temperature of the coolant, a heating or cooling status of a battery of the vehicle, a power electronics cooling status, a charging status of the vehicle, a drive mode of the vehicle, and a speed of the vehicle.

In various examples, the sensing device of the system is disposed downstream of a geometry change in the fluid line that is configured to amplify a vibration signal sensed in the fluid line at a location of the sensing device.

In various examples, the sensing device of the system is disposed downstream of a geometry change in the fluid line wherein the flow of the coolant prior to the geometry change is transverse to the flow of the coolant at a location of the sensing device.

In various examples, the sensing device of the system is disposed downstream of an arcuate right angle bend in the fluid line such that the flow of the coolant prior to the arcuate right angle bend is perpendicular to the flow of the coolant at a location of the sensing device.

In various examples, the vibration signal thresholds of the system include a first threshold having a first signal characteristic and a second threshold having a second signal characteristic, wherein the second signal characteristic is less than the first signal characteristic, wherein the controller is configured to, by the one or more processors, determine that the flow of the coolant through the fluid line is normal in response to the one or more signal characteristics being greater than the first threshold, that the flow of the coolant through the fluid line is low or aerated in response to the one or more signal characteristics of the vibrations being between the first threshold and the second threshold, and that there is no flow of the coolant through the fluid line in response to the one or more signal characteristics of the vibrations being less than the second threshold.

In various examples, the remedial action of the system includes reporting a classification of the flow of the coolant through the fluid line to another component of the vehicle.

In various examples, the remedial action of the system includes initiating a de-aeration process configured to reduce a concentration of air within the fluid line.

In various examples, the sensing device of the system is an accelerometer functionally coupled to an exterior of the fluid line such that the accelerometer senses the vibrations of the fluid line without contacting the coolant, and wherein the one or more signal characteristics include at least one of a frequency and an amplitude of the vibrations sensed by the accelerometer.

A vehicle is provided that, in one example, includes an electronic device that generates heat during operation thereof, a cooling system comprising a fluid line configured to remove the heat generated by the electronic device with a coolant, a pump configured to flow the coolant through the fluid line of the cooling system, an accelerometer functionally coupled to an exterior of the fluid line and configured to sense vibrations in the fluid line caused by the flow of the coolant therein without contacting the coolant, and a controller in operable communication with the pump and the accelerometer. The controller is configured to, by one or more processors: receive vehicle state data of the vehicle, determine a recommended flow rate of the coolant of the cooling system based on the vehicle state data, wherein the recommended flow rate is configured to maintain the electronic device below a predetermined temperature, determine vibration signal thresholds based on the vehicle state data and the recommended flow rate, wherein the vibration signal thresholds includes a first threshold having a first signal characteristic and a second threshold having a second signal characteristic, wherein the second signal characteristic is less than the first signal characteristic, initiate operation of the pump to flow the coolant through the fluid line at the recommended flow rate, determine whether the flow of the coolant through the fluid line is stable, receive, from the accelerometer, sensor data indicative of the vibrations sensed in the fluid line, determine one or more signal characteristics of the vibrations sensed with the accelerometer while the flow of the coolant through the fluid line is stable, determine that the flow of the coolant through the fluid line is normal in response to the one or more signal characteristics being greater than the first threshold, that the flow of the coolant through the fluid line is low or aerated in response to the one or more signal characteristics of the vibrations being between the first threshold and the second threshold, and that there is no flow of the coolant through the fluid line in response to the one or more signal characteristics of the vibrations being less than the second threshold, and initiate a remedial action in response to a determination that the flow of the coolant through the fluid line is low or aerated or that there is no flow of the coolant through the fluid line.

In various examples, the accelerometer of the vehicle is disposed downstream of an arcuate right angle bend in the fluid line such that the flow of the coolant prior to the arcuate right angle bend is perpendicular to the flow of the coolant at a location of the accelerometer.

BRIEF DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding technical field, background, brief summary or the following detailed description. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Embodiments of the present disclosure may be described herein in terms of functional and/or logical block components and various processing steps. It should be appreciated that such block components may be realized by any number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with any number of systems, and that the systems described herein is merely exemplary embodiments of the present disclosure.

For the sake of brevity, conventional techniques related to signal processing, data transmission, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Figure 1:
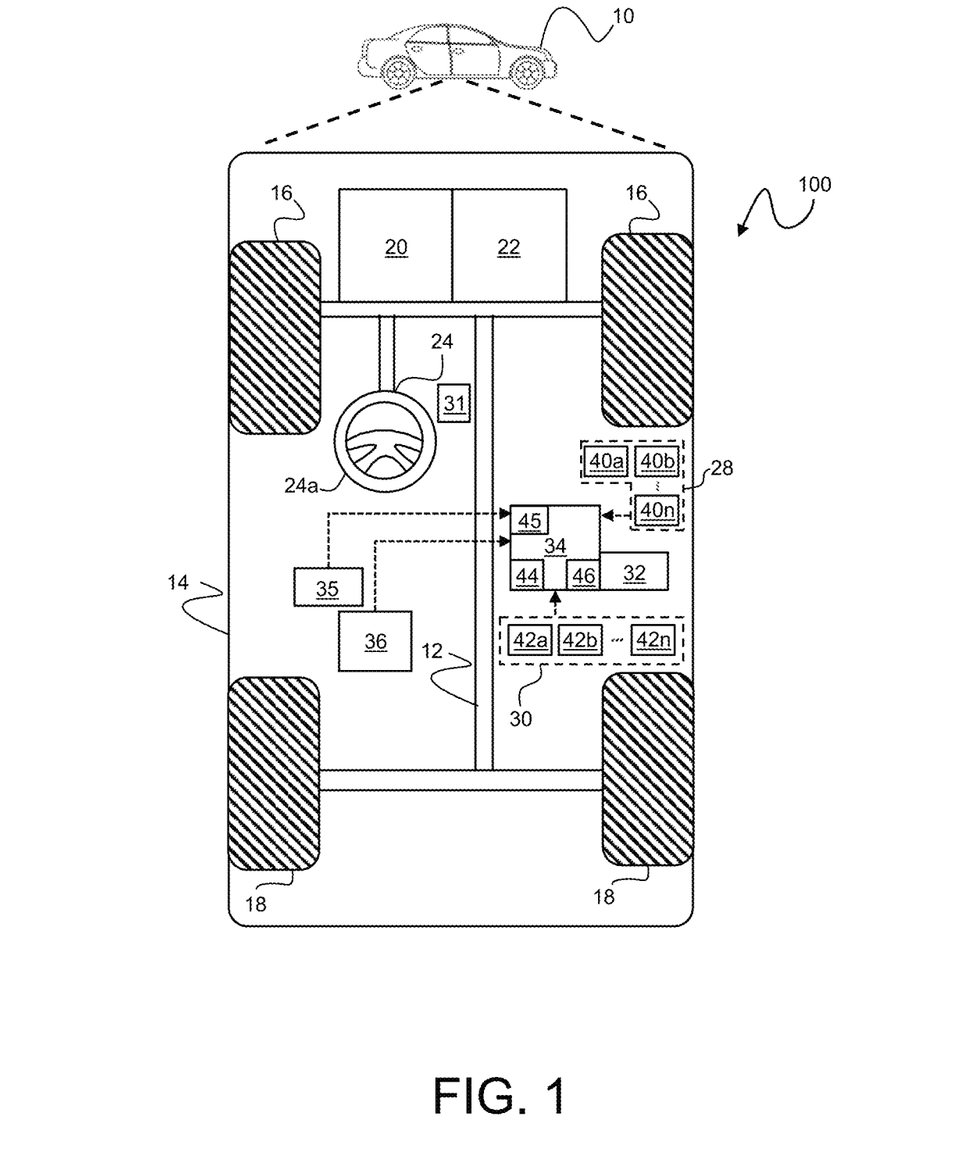
FIG. 1 is a functional block diagram illustrating a coolant monitoring system for a vehicle in accordance with various examples.

FIG. 1 illustrates a vehicle 10, according to a first example. The vehicle 10 includes a monitoring system 100 configured to monitor flow of a coolant within a cooling system 36 during operation of the vehicle 10 to promote awareness of the status of the cooling system 36, promote proper operation and longevity of electronic device(s) 35 cooled by the cooling system 36, and promote safety of the vehicle 10.

In certain examples, the vehicle 10 comprises an automobile. In various examples, the vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD), and/or various other types of vehicles in certain examples.

As depicted in FIG. 1, the exemplary vehicle 10 generally includes a chassis 12, a body 14, front wheels 16, and rear wheels 18. The body 14 is arranged on the chassis 12 and substantially encloses components of the vehicle 10. The body 14 and the chassis 12 may jointly form a frame. The wheels 16-18 are each rotationally coupled to the chassis 12 near a respective corner of the body 14.

The vehicle 10 further includes a propulsion system 20, a transmission system 22, a steering system 24, a sensor system 28, an actuator system 30, at least one data storage device 32, at least one controller 34, the electronic device 35, and the cooling system 36. The propulsion system 20 includes an internal combustion engine, such as a gasoline or diesel fueled combustion engine, an electric motor, or a hybrid electric motor and combustion engine system. The transmission system 22 is configured to transmit power from the propulsion system 20 to the wheels 16-18 according to selectable speed ratios. According to various examples, the transmission system 22 may include a step-ratio automatic transmission, a continuously-variable transmission, or other appropriate transmission. The steering system 24 influences a position of the wheels 16-18. While depicted as including a steering wheel 24a for illustrative purposes, in some examples contemplated within the scope of the present disclosure, the steering system 24 may not include a steering wheel.

The sensor system 28 includes one or more sensing devices 40a-40n that sense observable conditions of the exterior environment, the interior environment, and/or a status or condition of a corresponding component of the vehicle 10 and provide such condition and/or status to other systems of the vehicle 10, such as the controller 34. It should be understood that the vehicle 10 may include any number of the sensing devices 40a-40n. The sensing devices 40a-40n can include, but are not limited to, vibration sensors (e.g., accelerometer), temperature sensors, speed sensors, device status and feedback sensors, etc.

The actuator system 30 includes one or more actuator devices 42a-42n that control one or more vehicle features such as, but not limited to, the propulsion system 20, the transmission system 22, the steering system 24, and the cooling system 36.

The data storage device 32 stores data for use in controlling the vehicle 10 and/or systems and components thereof. As can be appreciated, the data storage device 32 may be part of the controller 34, separate from the controller 34, or part of the controller 34 and part of a separate system. The data storage device 32 can be any suitable type of storage apparatus, including various different types of direct access storage and/or other memory devices. In one example, the data storage device 32 comprises a program product from which a computer readable memory device can receive a program that executes one or more implementations of one or more processes of the present disclosure, such as the steps of the process discussed further below in connection with FIGS. 3 and 4. In another example, the program product may be directly stored in and/or otherwise accessed by the memory device and/or one or more other disks and/or other memory devices.

The controller 34 includes at least one processor 44, a communication bus 45, and a computer readable storage device or media 46. The processor 44 performs the computation and control functions of the controller 34. The processor 44 can be any custom made or commercially available processor, a central processing unit (CPU), a graphics processing unit (GPU), an auxiliary processor among several processors associated with the controller 34, a semiconductor-based microprocessor (in the form of a microchip or chip set), a macroprocessor, any combination thereof, or generally any device for executing instructions. The computer readable storage device or media 46 may include volatile and nonvolatile storage in read-only memory (ROM), random-access memory (RAM), and keep-alive memory (KAM), for example. KAM is a persistent or non-volatile memory that may be used to store various operating variables while the processor 44 is powered down. The computer-readable storage device or media 46 may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller 34 in controlling the vehicle 10. The bus 45 serves to transmit programs, data, status and other information or signals between the various components of the vehicle 10. The bus 45 can be any suitable physical or logical means of connecting computer systems and components. This includes, but is not limited to, direct hard-wired connections, fiber optics, infrared, and wireless bus technologies.

The instructions may include one or more separate programs, each of which comprises an ordered listing of executable instructions for implementing logical functions. The instructions, when executed by the processor 44, receive and process signals from the sensor system 28, perform logic, calculations, methods and/or algorithms, and generate data based on the logic, calculations, methods, and/or algorithms. Although only one controller 34 is shown in FIG. 1, the vehicle 10 can include any number of controllers 34 that communicate over any suitable communication medium or a combination of communication mediums and that cooperate to process the sensor signals, perform logic, calculations, methods, and/or algorithms, and generate data.

As can be appreciated, that the controller 34 may otherwise differ from the example depicted in FIG. 1. For example, the controller 34 may be coupled to or may otherwise utilize one or more remote computer systems and/or other control systems, for example as part of one or more of the above-identified vehicle devices and systems. It will be appreciated that while this example is described in the context of a fully functioning computer system, those skilled in the art will recognize that the mechanisms of the present disclosure are capable of being distributed as a program product with one or more types of non-transitory computer-readable signal bearing media used to store the program and the instructions thereof and carry out the distribution thereof, such as a non-transitory computer readable medium bearing the program and containing computer instructions stored therein for causing a computer processor (such as the processor 44) to perform and execute the program. Such a program product may take a variety of forms, and the present disclosure applies equally regardless of the particular type of computer-readable signal bearing media used to carry out the distribution. Examples of signal bearing media include recordable media such as floppy disks, hard drives, memory cards and optical disks, and transmission media such as digital and analog communication links. It will be appreciated that cloud-based storage and/or other techniques may also be utilized in certain examples. It will similarly be appreciated that the computer system of the controller 34 may also otherwise differ from the example depicted in FIG. 1, for example in that the computer system of the controller 34 may be coupled to or may otherwise utilize one or more remote computer systems and/or other control systems.

Figure 2:
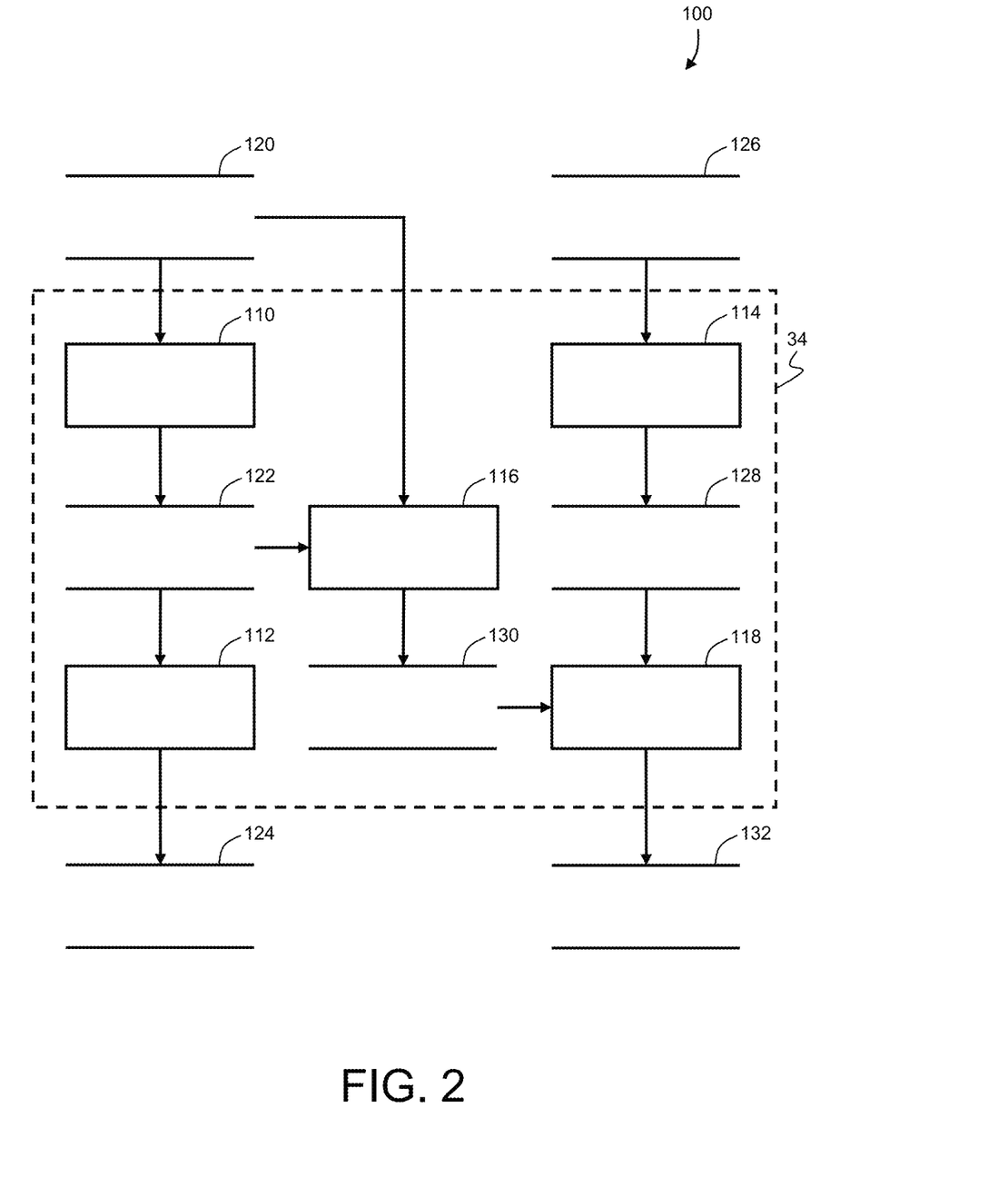
FIG. 2 is a dataflow diagram of the coolant monitoring system of FIG. 1 in accordance with various examples.

With reference to FIG. 2 and with continued reference to FIG. 1, a dataflow diagram illustrates elements of the monitoring system 100 of FIG. 1 in accordance with various examples. As can be appreciated, various examples of the system 100 according to the present disclosure may include any number of modules embedded within the controller 34 which may be combined and/or further partitioned to similarly implement systems and methods described herein. Furthermore, inputs to the system 100 may be received from other control modules (not shown) associated with the vehicle 10, and/or determined/modeled by other sub-modules (not shown) within the controller 34. Furthermore, the inputs might also be subjected to preprocessing, such as sub-sampling, noise-reduction, normalization, feature-extraction, missing data reduction, and the like. In various examples, the system 100 includes a coolant flow module 110, a control module 112, a vibration module 114, a threshold module 116, and a remedial action module 118.

In various examples, the coolant flow module 110 receives as input vehicle state data 120 generated by the sensor system 28 and/or other components or systems of the vehicle 10. The vehicle state data 120 includes various data indicating information relating to a current status and operating conditions of the vehicle 10. The vehicle state data 120 may include, but is not limited to, a temperature of the coolant, a heating or cooling status of a battery of the vehicle 10, a power electronics cooling status, a charging status of the vehicle 10, a drive mode of the vehicle 10, a speed of the vehicle 10, thermally managed device temperatures, power consumption, exterior air temperatures (outside of the vehicle 10), and vehicle fault data. The coolant flow module 110 processes the vehicle state data 120 to determine a recommended flow rate of the coolant of the cooling system 36. The recommended flow rate may be, for example, a flow rate of the coolant sufficient or adequate to provide an optimal, desired, or minimum cooling rate for the electronic device(s) cooled thereby (e.g., the electronic device 35). In some examples, the recommended flow rate of the coolant may be a cooling rate necessary to maintain a temperature of the electronic device(s) cooled thereby within an operating temperature range recommended by the manufacturer or otherwise below a predetermined temperature. The coolant flow module 110 generates coolant flow data 122 that includes various data indicating the recommended flow rate.

In various examples, the control module 112 receives as input the coolant flow data 122 generated by the coolant flow module 110. The control module 112 generates control data 124 that includes various data configured to initiate, activate, or control a pump of the cooling system 36 to flow the coolant through a fluid line of the cooling system 36 at the recommended flow rate. The control module 112 may transmit the control data 124 to the pump and/or a controller configured to operate the pump.

In various examples, the vibration module 114 receives as input sensor data 126 generated by the sensor system 28. The sensor data 126 includes various data indicating sensed vibrations of the fluid line of the cooling system 36. The vibration module 114 processes the sensor data 126 to determine one or more signal characteristics of the sensed vibrations of the fluid line. In some examples, the vibration module 114 performs a conversion process to determine a frequency and/or an amplitude of the vibrations over time. Various methods may be used to convert the sensed vibration patterns to a frequency domain. In some examples, a Fast Fourier Transform algorithm is used to convert the sensed vibrations to frequency and amplitude thereof. The vibration module 114 generates vibration data 128 that includes various data indicating the determined one or more signal characteristics of the vibrations.

In some examples, the vibration module 114 is configured to determine the one or more signal characteristics of only vibrations that occur in the fluid line while the coolant flow therethrough is stable. As used herein, the coolant flow is considered stable when the flow rate remains substantially constant (at a non-zero flow rate) and/or within a defined range for a predetermined period of time. Various methods may be used to determine whether the flow is stable and/or limit the sensed vibrations used for subsequent calculations to those obtained during stable flow conditions. In some examples, the vibration module 114 may continuously receive the vibration data 128, process the vibration data 128 to determine whether the sensed vibrations indicated therein are stable, and then use only the sensed vibrations that occurred during such periods of stable flow to determine the one or more signal characteristics. In some examples, the vibration module 114 or another module of the vehicle 10 may identify periods of stable flow based on the vehicle state data (e.g., constant speed, consistent drive mode, etc.) and initiate the sensor system 28 to sense the vibrations only during such periods of stable flow. Examples such as these wherein vibrations are analyzed only during periods of stable flow of the coolant may promote accuracy of the resulting classification of the flow.

In various examples, the threshold module 116 receives as input the vehicle state data 120 generated by the sensor system 28 and/or other components or systems of the vehicle 10. In various examples, the threshold module 116 receives as input the coolant flow data 122 generated by the coolant flow module 110. The threshold module 116 performs an analysis of the vehicle state data 120 and the coolant flow data 122 to determine vibration signal thresholds. The threshold module 116 generates threshold data 130 that includes various data indicating the determined vibration signal thresholds.

The vibration signal thresholds may include one or more sets or ranges of the one or more signal characteristics (e.g., frequencies and/or amplitudes) of vibrations that are associated with various types of coolant flow within the cooling system. For example, the vibration signal thresholds may include a first threshold having a first signal characteristic and a second threshold having a second signal characteristic, wherein the second vibration threshold is less than the first vibration threshold.

Various methods may be used to define the vibration signal thresholds associated with various recommended flow rates. In some examples, the vibration signal thresholds may be defined through experiments. In some examples, the vibration signal thresholds may be defined through computational modeling.

In various examples, the remedial action module 118 receives as input the vibration data 128 generated by the vibration module 114. In various examples, the remedial action module 118 receives as input the threshold data 130 generated by the threshold module 116. The remedial action module 118 performs an analysis of the vibration data 128 and the threshold data 130 that includes a comparison of the one or more signal characteristics of the vibrations with the vibration signal thresholds. Based on this analysis, the remedial action module 118 initiates or performs a remedial action. Various remedial actions may be initiated or performed. In one example, the remedial action module 118 may determine a classification of the flow of the coolant through the fluid line and report the classification to one or more other components of the vehicle 10, such as a controller of the pump of the cooling system 36 or a health monitoring system configured to monitor the health or status of the cooling system 36 and/or various systems of the vehicle 10. In another example, the remedial action module 118 may initiate a de-aeration process configured to reduce a concentration of air within the fluid line. The remedial action module 118 generates remedial action data 132 that includes various data configured to initiate or perform the one or more remedial actions. For example, the remedial action data 132 may include a determined classification of the flow of the coolant through the fluid line.

In certain examples wherein the remedial action module 118 reports a classification of the flow of the coolant, the classification of the flow of the coolant through the fluid line may include classifying the flow of the coolant as normal, expected, or "correct flow" in response to the one or more signal characteristics of the vibrations being greater than the first threshold. That is, the one or more signal characteristics above the first threshold correspond to coolant flows that match or are within an acceptable range of the flow rate at which the pump is operating (i.e., the recommended flow rate). In some examples, the first threshold may correspond to a minimum acceptable flow of the fluid under normal operating conditions of the cooling system at the recommended flow rate.

As a further example, classification of the flow of the coolant through the fluid line may include classifying the flow of the coolant as low or aerated in response to the one or more signal characteristics of the vibrations being between the first threshold and the second threshold. That is, the flow through the fluid line is below a flow that is acceptable for the flow rate at which the pump is operating (e.g., the recommended flow rate). In such example, the classification of "low or aerated flow" may indicate that the cooling system or a component thereof is malfunctioning or broken, that there is an air leak in the system, that the coolant level is low, or some other issue that may need to be addressed to reinstate proper flow within the cooling system.

As yet a further example, classification of the flow of the coolant through the fluid line may include classifying the flow of the coolant as "no flow" in response to the one or more signal characteristics of the vibrations being less than the second threshold. In such example, classification of no flow may indicate that there is a blockage within the fluid line and/or the cooling system that is partially or entirely impeding the flow of the fluid.

Figure 3:
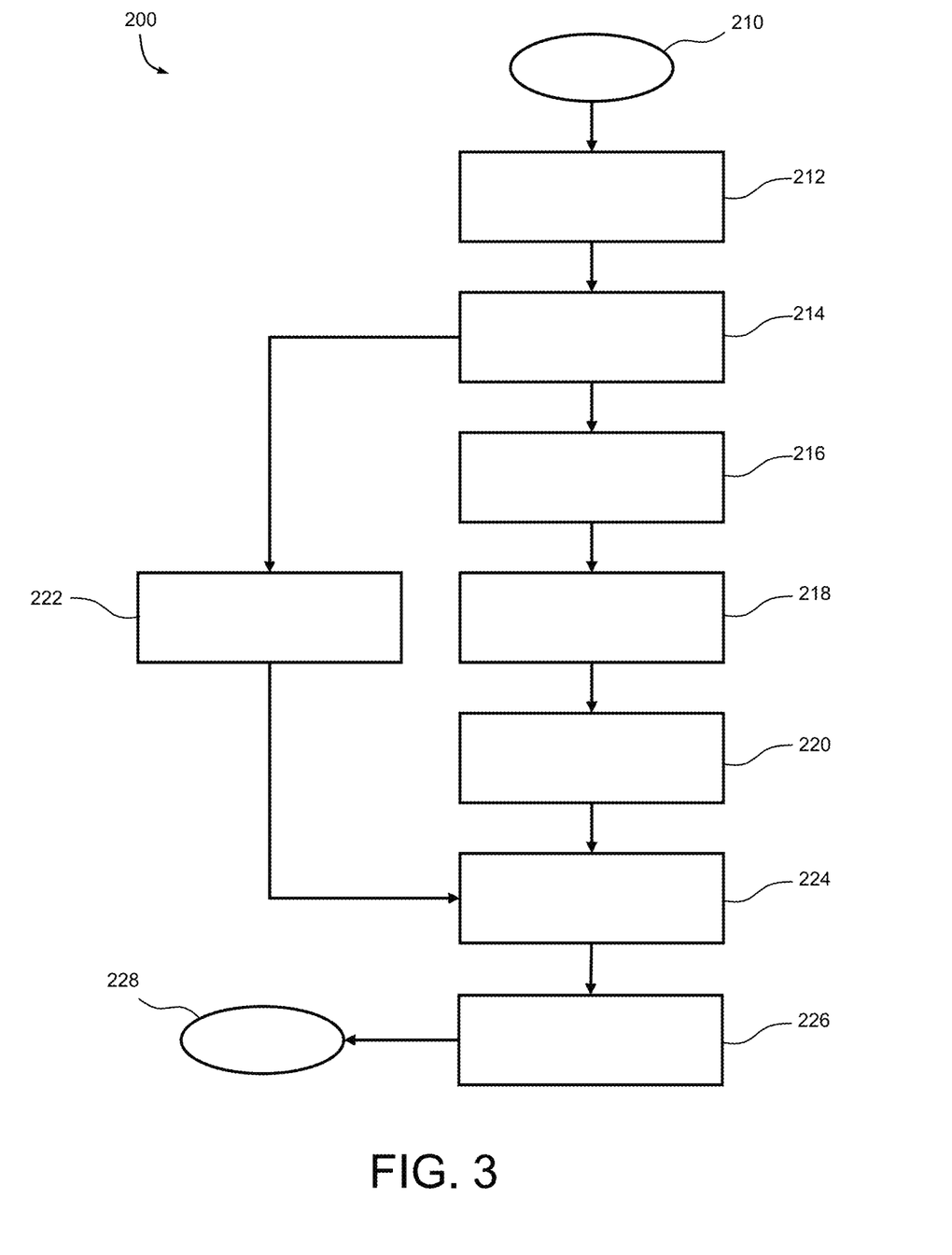
FIG. 3 is a flow diagram of a method for monitoring coolant flow in a cooling system of a vehicle in accordance with various examples.

With reference now to FIG. 3 and with continued reference to FIGS. 1-2, a flowchart provides a method 200 for monitoring a cooling system of a vehicle, such as performed by the monitoring system 100, in accordance with various examples. As can be appreciated in light of the disclosure, the order of operation within the method 200 is not limited to the sequential execution as illustrated in FIG. 3, but may be performed in one or more varying orders as applicable and in accordance with the present disclosure. In various examples, the method 200 can be scheduled to run based on one or more predetermined events, and/or can run continuously during operation of the vehicle.

In one example, the method 200 may start at 210. At 212, the method 200 may include receiving vehicle state data of the vehicle. At 214, the method 200 may include determining a recommended flow rate of a coolant of the cooling system based on the vehicle state data. In some examples, the recommended flow rate is configured to maintain the electronic device below a predetermined temperature. At 216, the method 200 may include operating a pump of the vehicle to flow the coolant through the fluid line of the cooling system at the recommended flow rate to remove heat generated by an electronic device of the vehicle.

At 218, the method 200 may include determining whether the flow of the coolant through the fluid line is stable. At 220, the method 200 may include sensing, with a sensing device (e.g., one or more of the sensing devices 40a-40n) of the vehicle, vibrations in the fluid line caused by the flow of the coolant therein. In some examples, the sensing device is an accelerometer functionally coupled to an exterior of the fluid line. At 224, the method 200 may include determining one or more signal characteristics (e.g., frequency and/or amplitude over time) of the vibrations sensed with the sensing device. At 222, the method 200 may include determining vibration signal thresholds based on the vehicle state data and the recommended flow rate.

At 226, the method 200 may include initiating or performing a remedial action based on a comparison of the one or more signal characteristics of the vibrations to the vibration signal thresholds. Various remedial actions may be performed. In some examples, the remedial action may include determining a classification of the flow of the coolant through the fluid line and reporting the classification to one or more other components of the vehicle. In some examples, the classification may be low flow, aerated flow, or no flow of the coolant in the fluid line. In one example, the remedial action includes initiating a de-aeration process configured to reduce a concentration of air within the fluid line. The method 200 may end at 228.

Figure 4:
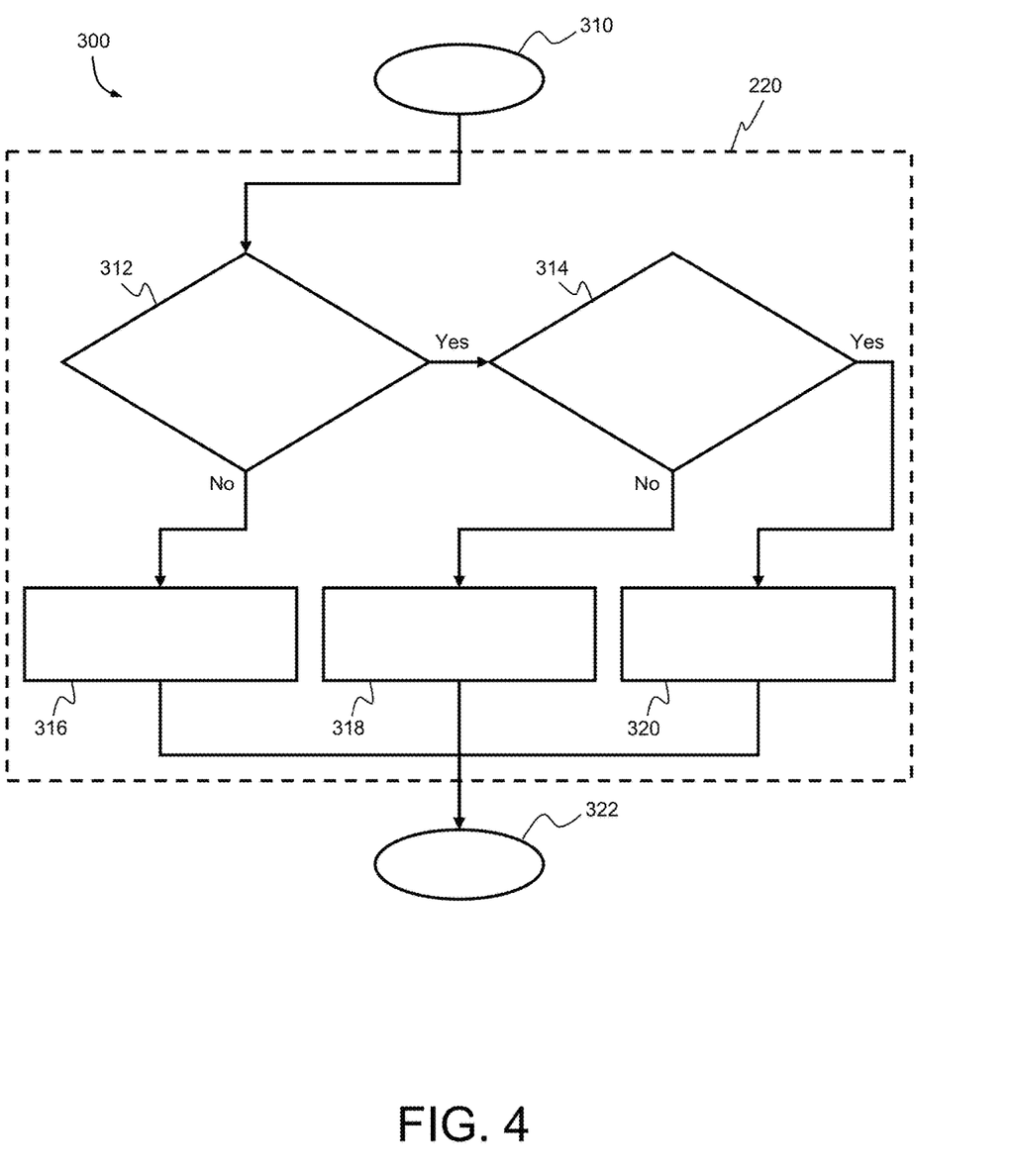
FIG. 4 is a flow diagram of a method for classification of coolant flow in a cooling system of a vehicle in accordance with various examples.

With reference now to FIG. 4 and with continued reference to FIGS. 1-3, a flowchart provides a method 300 for classification of the flow of the coolant through the fluid line of the cooling system, such as performed by the monitoring system 100, in accordance with various examples. The method 200 may represent a part or all of the processes performed at 224 of the method 200 of FIG. 3.

The method 300 may start at 310. At 312, the method 300 may include comparing the one or more signal characteristics of the vibrations to a low threshold of the vibration signal thresholds. If the one or more signal characteristics of the vibrations are less than the low threshold, then the method 300 determines at 316 that there is little or no flow of the coolant through the fluid line. If the one or more signal characteristics of the vibrations is greater than the low threshold at 312, then the method 300 continues to 314.

At 314, the method 300 may include comparing the one or more signal characteristics of the vibrations to a high threshold of the vibration signal thresholds. If the one or more signal characteristics of the vibrations are less than the high threshold, then the method 300 determines at 318 that the flow is low (e.g., below normal or expected) and/or aerated. If the one or more signal characteristics of the vibrations is greater than the high threshold, then the method 300 determines at 320 that the flow is normal, expected, and/or correct. The method 300 may end at 322.

Figure 5:
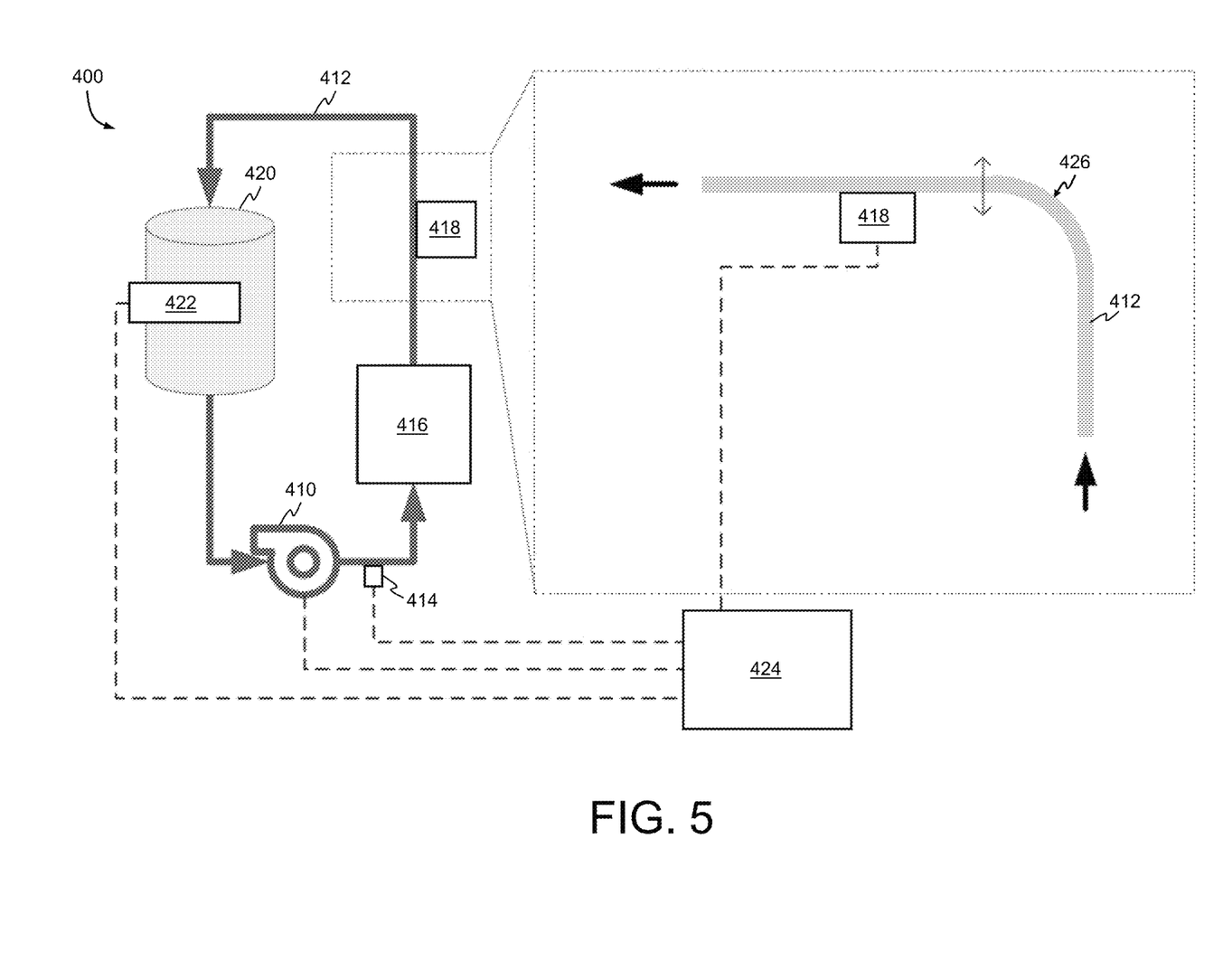
FIG. 5 is a functional block diagram of a cooling system of a vehicle in accordance with various examples.

With reference to FIG. 5 and with continued reference to FIGS. 1-4, a nonlimiting example of a cooling system 400 is presented, which in some examples may be a portion of or an entirety of the cooling system 36 of FIG. 1. In this example, the cooling system 400 includes a pump 410, a fluid line 412, a temperature sensing device 414, an electronic device 416 (e.g., the electronic device 35), a vibration sensing device 418, a surge tank 420, a coolant level sensing device 422, and a controller 424 (e.g., the controller 34). It should be understood that the cooling system 400 may include additional components not represented in FIG. 5.

The pump 410 is configured to controllably flow a coolant in a circuit through the fluid line 412 to remove heat generated by the electronic device 416. The surge tank 420 may be configured to, for example, regulate pressure and volume of the coolant within the cooling system 400. The temperature sensing device 414 is configured to sense, measure, or otherwise detect a temperature of the coolant in the fluid line 412. The vibration sensing device 418 is configured to sense, measure, or otherwise detect vibrations in the fluid line 412 or other conditions of the fluid line 412 from which vibrations may be derived. In some examples, the vibration sensing device 418 is an accelerometer functionally coupled to an exterior of the fluid line. The coolant level sensing device 422 is configured to sense, measure, or otherwise detect a coolant level within the surge tank 420 or other conditions from which the coolant level within the surge tank 420 may be derived. In some examples, one or more of the temperature sensing device 414, the vibration sensing device 418, and the coolant level sensing device 422 may be included in the sensing devices 40*a*-40*n*.

The controller 424 is in operable communication with each of the other components of the cooling system 400. During operation of the cooling system 400, the controller 424 may receive pump control and feedback from the pump 410, temperature feedback from the temperature sensing device 414, vibration feedback from the vibration sensing device 418, and coolant level feedback from the coolant level sensing device 422. The controller 424 may control or initiate operation of the pump 410 to flow the coolant through the fluid line 412. In various examples, the controller 424 may execute the method 200 of FIG. 3 to monitor the flow of the coolant within the fluid line 412.

In this example, the fluid line 412 includes a section 426 that includes a geometry change that is configured to amplify a vibration signal sensed in the fluid line 412 at the location of the vibration sensing device 418 immediately downstream of the section 426. In some examples, the geometry change is configured such that the flow of the coolant prior to the section 426 is transverse to the flow of the coolant at the location of the vibration sensing device 418. In the example of FIG. 5, the section 426 is realized as an arcuate right angle or corner section that includes a substantially 90° bend that provides for the flow of the coolant prior to the section 426 to be perpendicular to the flow of the coolant at the location of the vibration sensing device 418. The section 426 is exemplary and other geometry changes may be provided in the fluid line 412 to amplify the vibration signal.

The systems and methods disclosed herein provide various benefits over certain existing systems and methods. For example, loss of coolant flow to an electronic device may result in overheating and/or failure thereof. The systems and methods disclosed herein provide for monitoring, classification, and, optionally, reporting of the flow of the coolant based on sensed vibrations therein. As such, the systems and methods disclosed herein effectuate an improvement for vehicle-based cooling systems.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method for monitoring a fluid line in a vehicle, comprising:
   receiving, by one or more processors, vehicle state data of the vehicle;
   determining, by the one or more processors, a recommended flow rate of a coolant based on the vehicle state data;
   determining, by the one or more processors, vibration signal thresholds based on the vehicle state data and the recommended flow rate;
   operating a pump of the vehicle to flow the coolant through the fluid line at the recommended flow rate to remove heat generated by an electronic device of the vehicle, wherein the recommended flow rate is configured to maintain the electronic device below a predetermined temperature;
   determining, by the one or more processors, whether the flow of the coolant through the fluid line is stable;
   sensing, with a sensing device of the vehicle, vibrations in the fluid line caused by the flow of the coolant therein;

determining, by the one or more processors, one or more signal characteristics of the vibrations sensed with the sensing device while the flow of the coolant through the fluid line was stable; and initiating, by the one or more processors, a remedial action based on a comparison of the one or more signal characteristics of the vibrations to the vibration signal thresholds.

2. The method of claim 1, wherein the vehicle state data includes at least one of a temperature of the coolant, a heating or cooling status of a battery of the vehicle, a power electronics cooling status, a charging status of the vehicle, a drive mode of the vehicle, and a speed of the vehicle.

3. The method of claim 1, wherein the sensing device is disposed at a location downstream of a geometry change in the fluid line that is configured to amplify a vibration signal sensed in the fluid line at the location of the sensing device.

4. The method of claim 1, wherein the sensing device is disposed at a location downstream of a geometry change in the fluid line such that the flow of the coolant prior to the geometry change is transverse to the flow of the coolant at the location of the sensing device.

5. The method of claim 1, wherein the sensing device is disposed at a location downstream of an arcuate right angle bend in the fluid line such that the flow of the coolant prior to right angle bend is perpendicular to the flow of the coolant at the location of the sensing device.

6. The method of claim 1, wherein the vibration signal thresholds include a first threshold having a first signal characteristic and a second threshold having a second signal characteristic, wherein the second signal characteristic is less than the first signal characteristic, the method including determining, by the one or more processors, that the flow of the coolant through the fluid line is normal in response to the one or more signal characteristics of the vibrations being greater than the first threshold, that the flow of the coolant through the fluid line is low or aerated in response to the one or more signal characteristics of the vibrations being between the first threshold and the second threshold, and that there is no flow of the coolant through the fluid line in response to the one or more signal characteristics of the vibrations being less than the second threshold.

7. The method of claim 1, wherein the remedial action includes reporting a classification of the flow of the coolant through the fluid line to another component of the vehicle.

8. The method of claim 1, wherein the remedial action includes initiating a de-aeration process configured to reduce a concentration of air within the fluid line.

9. The method of claim 1, wherein the sensing device is an accelerometer functionally coupled to an exterior of the fluid line such that the accelerometer senses the vibrations of the fluid line without contacting the coolant, and wherein the one or more signal characteristics include at least one of a frequency and an amplitude of the vibrations sensed by the accelerometer.

10. A system for a vehicle, comprising:
a cooling system comprising a fluid line configured to remove heat generated by an electronic device of the vehicle with a coolant;
a pump configured to flow the coolant through the fluid line of the cooling system;
a sensing device configured to sense vibrations in the fluid line caused by the flow of the coolant; and
a controller in operable communication with the pump and the sensing device, the controller configured to, by one or more processors:
receive vehicle state data of the vehicle;
determine a recommended flow rate of the coolant of the cooling system based on the vehicle state data, wherein the recommended flow rate is configured to maintain the electronic device below a predetermined temperature;
determine vibration signal thresholds based on the vehicle state data and the recommended flow rate;
initiate operation of the pump to flow the coolant through the fluid line at the recommended flow rate;
determine whether the flow of the coolant through the fluid line is stable;
receive, from the sensing device, sensor data indicative of the vibrations sensed in the fluid line;
determine one or more signal characteristics of the vibrations sensed with the sensing device while the flow of the coolant through the fluid line is stable; and
initiate a remedial action based on a comparison of the one or more signal characteristics of the vibrations to the vibration signal thresholds.

11. The system of claim 10, wherein the vehicle state data includes at least one of a temperature of the coolant, a heating or cooling status of a battery of the vehicle, a power electronics cooling status, a charging status of the vehicle, a drive mode of the vehicle, and a speed of the vehicle.

12. The system of claim 10, wherein the sensing device is disposed downstream of a geometry change in the fluid line that is configured to amplify a vibration signal sensed in the fluid line at a location of the sensing device.

13. The system of claim 10, wherein the sensing device is disposed downstream of a geometry change in the fluid line wherein the flow of the coolant prior to the geometry change is transverse to the flow of the coolant at a location of the sensing device.

14. The system of claim 10, wherein the sensing device is disposed downstream of an arcuate right angle bend in the fluid line such that the flow of the coolant prior to the arcuate right angle bend is perpendicular to the flow of the coolant at a location of the sensing device.

15. The system of claim 10, wherein the vibration signal thresholds include a first threshold having a first signal characteristic and a second threshold having a second signal characteristic, wherein the second signal characteristic is less than the first signal characteristic, wherein the controller is configured to, by the one or more processors, determine that the flow of the coolant through the fluid line is normal in response to the one or more signal characteristics being greater than the first threshold, that the flow of the coolant through the fluid line is low or aerated in response to the one or more signal characteristics of the vibrations being between the first threshold and the second threshold, and that there is no flow of the coolant through the fluid line in response to the one or more signal characteristics of the vibrations being less than the second threshold.

16. The system of claim 10, wherein the remedial action includes reporting a classification of the flow of the coolant through the fluid line to another component of the vehicle.

17. The system of claim 10, wherein the remedial action includes initiating a de-aeration process configured to reduce a concentration of air within the fluid line.

18. The system of claim 10, wherein the sensing device is an accelerometer functionally coupled to an exterior of the fluid line such that the accelerometer senses the vibrations of the fluid line without contacting the coolant, and wherein the one or more signal characteristics include at least one of a frequency and an amplitude of the vibrations sensed by the accelerometer.

19. A vehicle, comprising:
an electronic device that generates heat during operation thereof;
a cooling system comprising a fluid line configured to remove the heat generated by the electronic device with a coolant;
a pump configured to flow the coolant through the fluid line of the cooling system;
an accelerometer functionally coupled to an exterior of the fluid line and configured to sense vibrations in the fluid line caused by the flow of the coolant therein without contacting the coolant; and
a controller in operable communication with the pump and the accelerometer, the controller configured to, by one or more processors:
receive vehicle state data of the vehicle;
determine a recommended flow rate of the coolant of the cooling system based on the vehicle state data, wherein the recommended flow rate is configured to maintain the electronic device below a predetermined temperature;
determine vibration signal thresholds based on the vehicle state data and the recommended flow rate, wherein the vibration signal thresholds includes a first threshold having a first signal characteristic and a second threshold having a second signal characteristic, wherein the second signal characteristic is less than the first signal characteristic;
initiate operation of the pump to flow the coolant through the fluid line at the recommended flow rate;
determine whether the flow of the coolant through the fluid line is stable;
receive, from the accelerometer, sensor data indicative of the vibrations sensed in the fluid line;
determine one or more signal characteristics of the vibrations sensed with the accelerometer while the flow of the coolant through the fluid line is stable;
determine that the flow of the coolant through the fluid line is normal in response to the one or more signal characteristics being greater than the first threshold, that the flow of the coolant through the fluid line is low or aerated in response to the one or more signal characteristics of the vibrations being between the first threshold and the second threshold, and that there is no flow of the coolant through the fluid line in response to the one or more signal characteristics of the vibrations being less than the second threshold; and
initiate a remedial action in response to a determination that the flow of the coolant through the fluid line is low or aerated or that there is no flow of the coolant through the fluid line.

20. The vehicle of claim 19, wherein the accelerometer is disposed downstream of an arcuate right angle bend in the fluid line such that the flow of the coolant prior to the arcuate right angle bend is perpendicular to the flow of the coolant at a location of the accelerometer.

* * * * *